United States Patent [19]

Knoth

[11] Patent Number: 4,789,621

[45] Date of Patent: Dec. 6, 1988

[54] SCREEN EMULSIONS COMPRISED OF DIACETONE-ACRYLAMIDE

[75] Inventor: Dale W. Knoth, Mundelein, Ill.

[73] Assignee: Advance Process Supply Company, Chicago, Ill.

[21] Appl. No.: 927,326

[22] Filed: Nov. 5, 1986

Related U.S. Application Data

[63] Continuation of Ser. No. 708,089, Mar. 5, 1985, abandoned.

[51] Int. Cl.[4] .......................... G03C 1/70; C08F 2/16
[52] U.S. Cl. .................................... 430/283; 430/308; 430/909; 101/128.4; 522/109; 524/459; 524/503
[58] Field of Search ...................... 430/308, 283, 909; 101/128.4; 525/57, 59; 524/459, 503; 522/109

[56] References Cited

U.S. PATENT DOCUMENTS 3,100,150 8/1963 Chismar et al. ................. 430/308
4,118,233 10/1978 Tsunoda et al. ................. 96/115 P

OTHER PUBLICATIONS

Martha Windholz, (ed), "7363. Polyvinyl Alcohol", *The Merck Index*, Ninth edition, Merck & Co., Inc., Rahway, N.J., U.S.A., 1976, p. 7362.

*Primary Examiner*—Paul R. Michl
*Assistant Examiner*—Cynthia Hamilton
*Attorney, Agent, or Firm*—Fitch, Even, Tabin & Flannery

[57] ABSTRACT

Screen emulsions in accordance with the present invention include a poly vinyl alcohol and poly vinyl acetate or a poly vinyl acetate copolymer emulsified in water along with appropriate amounts of diacetone acrylamide and an acrylic monomer. The emulsions preferably also include a cyclic amide, phthalate plasticizers, an initiator of monomer polymerization and a thermal stabilizer. The emulsions are intended to be admixed with a photosensitive free radical-generating compound that initiates cross-linking of the polymeric components and then applied to a mesh or screen. The screen is overlaid with an obliterating material, exposed to light and then washed to remove non-exposed emulsion. The resulting screen can be used without further hardening with both water- and solvent-based inks, and the film can be removed with emulsion-removing chemicals to permit reuse of the screen.

10 Claims, No Drawings

SCREEN EMULSIONS COMPRISED OF DIACETONE ACRYLAMIDE

This is a continuation of application Ser. No. 708,089, filed Mar. 5, 1985, abandoned.

The present invention relates to silk screening and the like and more particulary to improved photosensitive emulsions for coating screens.

BACKGROUND OF THE INVENTION

Silk screening is the process by which a screen or mesh is obliterated in negative image areas while leaving image areas of the screen open so that printing inks may pass through the screen in the open-mesh image areas to produce an image on a surface immediately behind the screen. To make a suitable printing screen, a mesh of silk, polyester, nylon or stainless steel wire is stretched across a frame, tautened and affixed to the frame to prevent the mesh from sagging or going limp during the printing process.

There have been, in the past, several known state of the art methods of non-photographic screens. For example, paper stencils are cut to create a negative image, then the paper is adhered to the screen, and printing ink is passed through the uncovered image areas to create the positive image on a surface therebehind. This method is useful for printing only a few impressions and cannot be used when fine detail is required. Blockout is a method used by applying a masking material to the desired negative image areas of a screen. The blockout material could consist of a glue, shellac or any polymer not affected by the screen printing ink. The old touche and glue method of making screens is sometimes being employed by those knowledgeable and skilled in this art, however, this is done to a limited extent, due to the fact fine detail is difficult to achieve and making a screen in this fashion is very laborious.

Another method of making a non-photographic stencil with hand-cut stencils. In this process, a film of gelatin-like layers are applied evenly over a paper or plastic film, the layers are hand-cut with a sharp blade to the image desired, and the gelatin is adhered to the mesh with a solvent or with water, depending upon the chemical composition of the gelatin. Once adhered and dried, the backing sheet is peeled from the screen, leaving the cut image to create the stencil.

A more recently developed process for imaging screens involves the use of photosensitive coatings, herein referred to as "emulsions" to coat the screen. The emulsions contain polymers which cross-link when exposed to actinic radiation sources, i.e., sources that produce light in the visible and/or ultraviolet frequencies. The photosensitive emulsions are coated on meshes or screens which are tautly stretched across a frame under darkened or safe-light conditions. The emulsions are allowed to dry, and an obliterating material, such as an opaque film positive, is placed over the screen for shielding imaging areas of the screen, and the screen is then exposed to an actinic light source which cross-links the polymers in the exposed, negative image areas of the screen. The cross-linked polymer bridges the mesh and thereby exhibits increased adherence to the mesh relative to the non-cross-linked emulsion in the imaging areas of the screen that were shielded by the obliterating material. The non-exposed emulsion is selectively removed from the screen, for example, by washing the screen with warm water. After the screen is thoroughly dried, the screen can be used for printing, ink passing through the image areas from where the non-exposed emulsion has been removed.

In a typical procedure, a screen printer simply applies the emulsion to the screen in a liquid state, allows it to dry, and then places the obliterating material over the dried polymer before exposing it to light. In a similar process, which is particularly suitable for producing excellent detail, the emulsion is applied to a sheet of transparent plastic. After the emulsion is dried, the sheet is laid over the screen with the emulsion against the screen. The emulsion is then re-solvated and redried. The obliterating material is laid directly over the sheet and the obliterating material side is exposed to light. Then the backing sheet is peeled away and the non-exposed emulsion is washed away from the image areas.

A variety of actinic radiation sources may be used to expose the screens, including carbon arc lamps, mercury vapor lamps, fluorescent lamps, particularly those with ultraviolet radiation-emitting phosphors, argon glow lamps, electronic flash lamps and photographic flood lamps. Both visible and ultraviolet light is suitable, but preferably the light is in or is weighted to the ultraviolet spectra.

The most commonly used type of photosensitive emulsion includes as the cross-linking polymers, poly vinyl alcohol and a copolymer of poly vinyl acetate. The poly vinyl acetetate copolymer has the general formula $A_xB_{1-x}$ where A is vinyl acetate and B is the comonomer. A typical comonomer for vinyl acetate is ethylene. The polymers are emulsified in water, and other ingredients, such as defoamers, colorants and plasticizers may be added, as is known to those skilled in the art.

To make the emulsions photosensitive, free radical-generating compounds, such as ammonium dichromate, potassium dichromate or diazo compounds, such as copolymer formaldehyde/p-diazo diphenylamine sulfate or benzenediazonium, 4-(phenylamino)-sulfate 1:1 polymer with formaldehyde, are admixed with the emulsion. To prevent premature cross-linking, the free radical-generating sensitizing compound is generally admixed with the emulsion just prior to its application as a coating to a screen. Generally, a manufacturer of an emulsion will recommend a specific activating chemical to be admixed in a specific amount with a particular emulsion.

The relative amounts of the poly vinyl alcohol and the poly vinyl acetate copolymer is selected according to the solvent-resistance or water-resistance desirably exhibited by the emulsion subsequent to its cross-linking. If a solvent-based ink is to be used, solvent-resistance is desired, and if a water-based ink is to be used, water-resistance is desired. Generally, higher proportions of the poly vinyl alcohol increase the solvent-resistance of the cross-linked emulsion film, whereas higher proportions of the poly vinyl acetate copolymer increase the water-resistance of the cross-linked emulsion film. Emulsion films of this type may either be solvent-resistant or water-resistant, but not both unless further treated. This is unfortunate, as it is frequently desirable to use the same screen for printing with both water-based and with solvent-based inks, for example, if a logo is to be printed onto two different fabrics, one receptive to water-based ink and other receptive to solvent-based ink.

While light-exposed, cross-linked emulsion films of the type described above are not both water-resistant and solvent-resistant, hardening techniques are known which make the emulsion films resistant both to solvent and to water. Such post treatment hardening techniques include exposing the screen to harsh chemicals, such as hydrochloric acid. A chelated ester of orthotitanic acid, such as tetrabutyltitanate, is often used for hardening. Sometimes used for hardening, but less often, are mild solutions of sodium hydroxide or calcium hydroxide. Each of these hardening solutions stabilizes the emulsion films on the screen by increasing the degree of cross-linking.

An important disadvantage of using hardening chemicals is that the hardened films cannot be easily removed from the mesh, and therefore, the mesh cannot be reclaimed for producing other images. Considering that mesh material is expensive and that the screen stretching process involves expensive labor, printers are reluctant to harden screens.

The emulsions presently used generally have a solids content (weight percentage of polymerizing material relative to total weight, including water) of at most about 30 to 35% weight percent. It would be desirable to increase the solids content of the polymer, as this would permit a printer to coat screens having coarse meshes with fewer applications of the emulsion. Other desirable attributes of photosensitive emulsions include high light sensitivity in order to minimize light exposure time, the ability to develop fine detail, which is a function of the strength of the cross-linked, light-exposed polymer film, the film strength being generally a function of the amount of polymer cross-linking. The cross-linked emulsion film should be readily removable with available emulsion removers to permit reuse of the screen.

SUMMARY OF THE INVENTION

Emulsions for silk screening or the like comprise poly vinyl alcohol, poly vinyl acetate or a poly vinyl acetate copolymer, diacetone acrylamide and an acrylic monomer. When mixed with an appropriate free radical-generating compound, spread across a mesh, exposed to light and dried, these emulsions produce a highly cross-linked film which is resistant to both water and solvent without further hardening and which can be removed from the screen with common emulsion removers. Emulsions formulated according to the present invention may contain between 40 and 50 weight percent solids (in water), are highly sensitive to actinic radiation and produce images with fine detail. Preferably the emulsion also includes a cyclic amide, such as N-vinylpyrrolidone, phthalate placticizers, polymerization initiators and thermal polymerization inhibitors.

DETAILED DESCRIPTION OF THE PREFERRED EMBODIMENTS

In accordance with the present invention, it is found that a water emulsion for silk screening or the like, formulated to contain poly vinyl alcohol and poly vinyl acetate or a poly vinyl acetate copolymer as the cross-linking polymers and which also includes an appropriate proportion of diacetone acrylamide and an acrylic monomer, exhibits several highly desirable properties. The emulsion, when mixed with a free radical-generating compound, coated on a screen, dried, and exposed to light, produces a film on the screen which is both solvent- and water-resistant without post hardening and which is removable from the screen with common emulsion removal agents, allowing the screen to be reused for other purposes. In accordance with preferred embodiments of the invention, emulsions also include one or more of the following: a cyclic amide, such as N-vinyl-2-pyrrolidone, a phthalate plasticizer, a monomer polymerization initiator, and a thermal polymerization inhibitor. The emulsions may also contain defoamers, surfactants and colorants, as is known in the art.

Similar to previously described emulsions, the emulsions of the present invention are based upon poly vinyl alcohol and poly vinyl acetate or poly vinyl acetate copolymers as the cross-linking polymers. The cross-linking of these polymers subsequent to exposure to light and in the presence of free radical-generating compounds, bridges the mesh, strongly adhering the polymer to the mesh as a film. Whereas, polymers protected from exposure, e.g., by obliterating materials, are easily washed from the screen with water, the cross-linked polymers bridging the mesh are retained to serve as a barrier to passage of ink through the screen.

Polyvinyl alcohol is present in the emulsions at between about 5 and about 15 weight percent and preferably between about 8 and about 10 weight percent. Polyvinyl acetate and/or poly vinyl acetate copolymers, having the general formula $A_xB_{1-x}$ where A is vinyl acetate, x is between 1 and about 0.5 and B is an unsaturated monomer, such as ethylene, ethyl hexyl-acrylate, N'methylol-acrylamide, or vinyl-acrylamide, is present at between about 15 and about 30 weight percent of the emulsion, and preferably at weight percents of between about 20 to about 25 weight percent. The total polymer content of the emulsion is between about 25 to about 35 weight percent and preferably from about 30 to about 35 weight percent.

The substantial improvement in the emulsions of the present invention are largely attributable to the additions of diacetone acrylamide, which is a vinyl monomer, and an acrylic monomer in conjunction with the polymeric components. Together, these additives increase the solids content. Each of the additives increases the light sensitivity of the emulsion, thereby helping to substantially reduce the light exposure time required to develop the screen. Importantly, the combination of diacetone acrylamide and an acrylic monomer substantially enhance the light-induced cross-linking of the polymeric components, thereby more tightly binding the polymers to the mesh.

A very important contribution of the diacetone acrylamide to the improved emulsions is its very low viscosity that enables spreadable emulsions to be produced having significantly higher solids content than were previously generally available. Diacetone acrylamide is provided at from about 4 to about 16 wt. percent of the emulsion and preferably from about 7 to about 10 wt. percent of the emulsion. Emulsions containing diacetone acrylamide may contain between about 40 and 50 wt. percent solids and still have an appropriate viscosity for spreading across a mesh, e.g., between about 20,000 and about 30,000 cps at 25° C. as measured with a Brookfield viscometer.

The cross-linked film that is eventually developed on the mesh of the printing screen, covering the mesh openings in the negative image areas of the screen, contains the cross-linked polymers, e.g., poly vinyl alcohol and poly vinyl acetate or poly vinyl acetate copolymer, with the polymers cross-linked, in part, by the diacetone acrylamide and acrylic monomer moieties. The diacetone acrylamide moieties in the film comprise between about 10 and about 50 weight percent relative to the cross-linked polymers in the film, and preferably between about 20 and about 35 weight percent relative to the cross-linked polymers.

The acrylic monomers that may be used are ethylenically unsaturated compounds which contain at least one terminal ethylenic group. It is most preferable that at least two or more terminal ethylenic groups be present. The monomer should have a boiling point of at least about 100° C. at atmospheric pressure and be capable of forming a high polymer by free radical photo-initiated chain-propagating addition-polymerization. These materials include unsaturated esters of polyols, particularly such esters of the methylene carboxylic acids, e.g., 2 ethyl-hexyl acrylate, ethylene diacrylate; diethylene glycol diacrylate; glycerol diacrylate; glycerol triacrylate; ethylene dimethacrylate; 1,3-propylene dimethacrylate; 1,2,4-butanetriorylate; 1,3-propylene dimethacrylate; 1,2,4-butanetrioltrimethacrylate; 1,4-benzendiol dimethacrylate; pentaerythritol tetramethacrylcate; 1,3-propanediol diacrylate; 1,6-hexanediol diacrylate; the bis-acrylates and methacrylates of polyethylene glycols of molecular weight 200–500; trimethlopropane triacrylate; pentaerythritol triacrylate and mixtures thereof. Monofunctional monomers may also be used as polymerizable diluents, but these are generally less satisfactory because of their high volatility and because they tend to form less durable polymers. The acrylic monomer comprises between about 4 and about 8 weight percent and preferably at least about 5 weight percent of the emulsion. In the dried film, the monomer moieties contribute between about 12 and about 30 weight percent relative to the cross-linked polymers.

The emulsion preferably includes a cyclic amide, N-vinyl-2-pyrrolidone being a preferred cyclic amide. The cyclic amide helps to hold the acrylic monomer in emulsion with the polymers, the acrylic monomers generally resisting emulsification with the polymers. Unsaturated cyclic amides, such as N-vinyl-2-pyrrolidone, further promote cross-linking. The cyclic amide is provided at between about 0.5 and about 3 wt. percent and preferably between about 1 and about 2 wt. percent.

It is known to add a plasticizer to emulsions to increase the resilient flexibility of the resultant films, and it is preferred, but optional, to include a plasticizer in emulsions according to the present invention. It is found that phthalate plasticizers work best for these emulsions, all phthalate plasticizers working well. A preferred plasticizer is dibutyl phthalate. Phthalate plasticizers are provided at between about 0.5 and about 3 weight percent of the emulsion and preferably at between about 1 and about 2 weight percent.

As noted above, emulsions formulated in accordance with the present invention are admixed with a free radical-generating sensitizing compound prior to their application to the screen. As is the case with previous emulsions, such compounds include ammonium dichromate, potassium dichromate, diazo compounds, such as copolymer formaldehyde/p-diazo diphenylamine sulfate or benzenediazonium 4-(phenylamino)-sulfate 1:1, polymer with formaldehyde. These compounds, in the presence of actinic radiation, generate free radicals which initiate cross-linking between the polymers.

When using monomers, including diacetone acrylamide and acrylic monomers which are intended to polymerize and cross-link with the emulsified polymers, it is preferred to include a photo initiator which is sensitive to actinic radiation, generating free radicals and promoting polymerization of the monomers. It is found that the sensitizing compounds, mentioned above, which are added just prior to application to promote cross-linking of the emulsified polymers, are less effective in initiating of the monomers; thus, the desirability of including photo-initiators of monomer polymerization. Photo-initiators are generally provided at between about 0.1 and about 10 wt. percent, preferably between about 1.5 and about 5 percent.

The photo-initiators used for the emulsions of the present invention are preferably those activatable by actinic radiation and thermally inactive at 185° C. and below. The most preferred initiators are acyloin ethers, such as the benzoin ethers, benzoin isobutyl ether; benzoin isopropyl ether; or alkyl-substituted anthraquinones, such as 2-tertbutylanthraquinone and 2-2-diethoxyacetophenone. Other initiators which may be used include quinones, such as 9,10-anthraquinone; 1-chloroanthraquinone; 2-chloroanthraquinone; 2-methylanthraquinone; 2-ethylanthraquinone; octamethylanthraquinone; 2-ethylanthraquinone; 1,4-naphthaquinone; 9,10-phenanthraquinone; 1,2-benzanthraquinone; 2,3-benzanthraquinone; 2-methyl-1,4-naphthaquinone; 2,3-dimethylanthraquinone; 2-phenylanthraquinone; 2,3-dichloronaphthaquinone; sodium salt of anthraquinone alpha-sulfonic acid; 3-chloro-2-methylantraquinone; retenequinone; 7,8,9,10-tetrahydronaphthacenequinone; 1,2,3,4-tretralhydrobenz(A)-anthracene-7,12-dione.

Other photo-initiators, which are less preferred because they may be thermally active at temperatures as low as 85° C., are nevertheless useful and include vicinal ketaldonyl compounds, such as diacetyl and benzil, alpha-ketaldonyl alcohols, such as benzoin and pivaloin; alpha-hydrocarbon-substituted aromatic acyloins; alpha-methylbenzoin; alpha-allylbenzoin; alphaphenylbenzoin. Certain aromatic ketones are also useful as a free radical-generating initiator activatable by actinic radiation, e.g., benzophenone and 4,4'-bisdialkylaminobenzophenones.

Thermal polymerizaton inhibitors are generally also preferably present in the emulsions. These materials act as antioxidants and stabilizers and include, for example, p-methoxyphenol, hydroquinone and alkyl- and aryl-substituted hydroquinones and quinones, tert-butyl catechol, cuprous chloride, 2,6-di-tert-butyl p-cresol, 2,2-methylenebis-(4-ethyl-6-t-butylphenol), phenothiazial, pyridine, nitrobenzene, dinitrobenzene, p-toluquinone, chloranil, aryl phosphites, and aryl alkyl phosphites. Such inhibitors are generally provided at between about 0.01 and about 1 weight percent of the emulsion and preferably between about 0.02 and about 0.06 weight percent.

As noted above, emulsions are preferably formulated according to the invention to have viscosities of between about 20,000 and about 30,000 cps at 25° C. as measured on a Brookfield viscometer. Preferably, the viscosity is about 25,000 cps. Emulsions are formulated to have thixotropic indexes of between about 1 and about 2 at 25° C. and specific gravities of between about 1 and about 1.25 at 25° C.

The invention will now be described in greater detail by way of specific examples.

EXAMPLE 1

An emulsion having the following composition is prepared:

| Components | Weight Percent |
| --- | --- |
| poly vinyl alcohol | 7.70 |
| poly vinyl acetate ethylene copolymer | 21.20 |
| diacetone acrylamide | 5.80 |
| N—vinyl-2-pyrrolidone | 1.20 |
| trimethylpropanetrioltriacrylate | 5.80 |
| dibutyl phthalate | 1.50 |
| *Irgacure 651 | 2.50 |
| Water | 54.30 |
| | 100.00 |

*A substituted Benzoinp;roduct of CIBA-BEIGY

This composition has a viscosity as measured on a Brookfield viscometer of 25,000 cps at 25° C., a thixotropic index of 1.6 at 25° C. and a specific gravity of 1.061 at 25° C. As can be seen from the table above, the solids content is about 45%, significantly higher than the 35% solids content which is about the maximum useful solid content of prior art poly vinyl alcohol-poly vinyl acetate copolymer emulsions.

To one liter of this emulsion is added 10 grams of copolymer formaldehyde/p-diazo diphenylamine sulfate, making the emulsion extremely sensitive to ultraviolet light.

The sensitized emulsion is applied under safe-light conditions to a 200 mesh nylon screen, a single application being used to coat the screen.

An opaque film positive is placed over the screen, and the screen and film positive are placed in a Polylite TM exposing apparatus which contains a bank of ultraviolet lights. The screen is exposed to the light for three minutes, and then the screen is subjected to a forceful spray of cold water which removes the non-exposed film from the screen.

The screen is used to print the image first using a water-based ink, such as Aqua-Set TM Acrylic Latex, and then is used to print using a solvent-based ink, such as Advance's LOV TM vinyl chloride. No deterioration of the image is exhibited when using either ink.

After using the screen for printing, the film is removed from the non-imaging areas of the mesh with a sodium metaperiodate-based emulsion remover, sold under the brand name IDC-9 by Advance Process Supply Company, Chicago. The screen is then useful for recoating.

EXAMPLE 2

The following are other useful emulsions formulated in accordance with the present invention:

| Components | Weight Percent |
| --- | --- |
| poly vinyl alcohol | 8.20 |
| poly vinyl acetate ethylene copolymer | 19.70 |
| diacetone acrylamide | 7.20 |
| N—vinyl-2-pyrrolidone | 1.10 |
| 2 ethyl-hexyl acrylate | 5.60 |
| dibutyl phthalate | 1.00 |
| Irgacure 651 | 2.00 |
| Water | balance |
| poly vinyl alcohol | 6.90 |
| poly vinyl acetate ethylene copolymer | 23.00 |
| diacetone acrylamide | 8.80 |
| N—vinyl-2-pyrrolidone | 1.50 |
| 1-6 hexanediol diacrylate | 4.30 |
| dibutyl phthalate | 1.70 |
| Irgacure 651 | 2.50 |
| Water | balance |
| poly vinyl alcohol | 7.90 |
| poly vinyl acetate ethylene copolymer | 20.20 |
| diacetone acrylamide | 6.80 |
| N—vinyl-2-pyrrolidone | 1.40 |
| ethylene diacrylate | 5.70 |
| dibutyl phthalate | 1.30 |
| 2-chloroanthraquinone | 2.40 |
| Water | balance |
| poly vinyl alcohol | 12.70 |
| poly vinyl acetate ethylene copolymer | 20.20 |
| diacetone acrylamide | 6.90 |
| N—vinyl-2-pyrrolidone | 1.00 |
| 1,3-propylene dimethacrylate | 6.20 |
| dibutyl phthalate | 1.90 |
| 2-methylanthraquinone | 2.50 |
| Water | balance |
| poly vinyl alcohol | 14.20 |
| poly vinyl acetate ethylene copolymer | 14.70 |
| diacetone acrylamide | 5.60 |
| N—vinyl-2-pyrrolidone | 1.00 |
| 1,3-propylene dimethyacrylate | 7.70 |
| dibutyl phthalate | 2.00 |
| 9,10-phenanthraquinone | 1.60 |
| Water | balance |
| poly vinyl alcohol | 12.70 |
| poly vinyl acetate ethylene copolymer | 18.60 |
| diacetone acrylamide | 6.30 |
| N—vinyl-2-pyrrolidone | 1.60 |
| 1,2,4-butanetrioltrimethacrylate | 4.80 |
| dibutyl phthalate | 1.50 |
| 2-tertbutylanthraquinone | 2.50 |
| Water | balance |
| poly vinyl alcohol | 7.90 |
| poly vinyl acetate ethylene copolymer | 20.20 |
| diacetone acrylamide | 4.80 |
| N—vinyl-2-pyrrolidone | 1.70 |
| diethylene glycol diacrylate | 5.60 |
| dibutyl phthalate | 1.40 |
| 2,3-benzanthraquinone | 2.30 |
| Water | balance |
| poly vinyl alcohol | 10.30 |
| poly vinyl acetate ethylene copolymer | 25.70 |
| diacetone acrylamide | 7.70 |
| N—vinyl-2-pyrrolidone | 1.10 |
| glycerol diacrylate | 6.80 |
| dibutyl phthalate | 1.00 |
| 1,4-naphthaquinone | 2.00 |
| Water | balance |
| poly vinyl alcohol | 10.70 |
| poly vinyl acetate ethylene copolymer | 28.90 |
| diacetone acrylamide | 7.70 |
| N—vinyl-2-pyrrolidone | 1.70 |
| 1,2,4-butanetriorylate | 4.60 |
| dibutyl phthalate | 1.40 |
| 2-2-diethoxyacetophenone | 2.30 |
| Water | balance |
| poly vinyl alcohol | 6.80 |
| poly vinyl acetate ethylene copolymer | 27.10 |
| diacetone acrylamide | 7.70 |
| N—vinyl-2-pyrrolidone | 1.80 |
| 1,6-hexanediol diacrylate | 6.90 |
| dibutyl phthalate | 1.70 |
| 2-ethylanthraquinone | 2.70 |
| Water | balance |
| poly vinyl alcohol | 14.20 |
| poly vinyl acetate ethylene copolymer | 20.10 |
| diacetone acrylamide | 6.10 |
| N—vinyl-2-pyrrolidone | 1.30 |
| 1,4-benzendiol dimethacrylate | 7.70 |
| dibutyl phthalate | 1.20 |
| 9,10-anthraquinone | 2.70 |
| Water | balance |
| poly vinyl alcohol | 12.70 |
| poly vinyl acetate ethylene copolymer | 23.20 |
| diacetone acrylamide | 4.60 |
| N—vinyl-2-pyrrolidone | 1.00 |
| pentaerythritol tetramethacrylcate | 5.70 |
| dibutyl phthalate | 1.50 |
| 2-methyl-1,4-naphthaquinone | 2.50 |
| Water | balance |

The emulsions described above are formulated without the sensitizing agent, which is admixed with the emulsion just prior to coating. Almost always, the emulsions are produced and marketed without the sensitizing agent in order to simplify the manufacturing process and to reduce the possibility of premature exposure to light polymerizing the emulsion. The free radical-generating sensitizing agent is generally admixed to the emulsion in amounts of between about 0.005 and about 0.01 percent by weight of the emulsion.

Emulsions according to the invention can also be coated on paper or plastic film to a thickness of from about 0.1 to about 30 mils, allowed to air dry, be placed on a tautened screen mesh, resolvated with sensitized emulsion, and air dried, to produce a photosensitive screen.

In addition to sodium metaperiodate as an emulsion remover, other chemicals which may be used to remove cross-linked emulsion from the screen include strongly oxidizing agents, including bleaches, such as sodium hyperchloride and calcium hyperchloride and strong bases, including concentrated solutions of sodium hydroxide and potassium hydroxide.

Several advantages of the present invention can now be more fully appreciated. The emulsions according to the present invention may be provided at a high solids content and still have an appropriate viscosity for application to a screen or mesh, thereby reducing the number of applications required to coat a mesh. The emulsions provide substantially increased cross-linking, more strongly bridging the polymers to the mesh, whereby the cross-linked polymers are resistant to both solvent- and water-based inks without requiring post hardening. Common removers readily remove the cross-linked emulsions, whereby the screen may be reused.

A further consequence of the increased cross-linking of the emulsions of the present invention is the increased strength of the films. This gives rise to a more detailed and clearly defined imaging because the cross-linked film is more likely to retain its exact configuration between the mesh fibers. Images produced using emulsions formulated in accordance with the invention are shown by microscopic examination to exhibit detail substantially finer than the size of the mesh itself as small protrusions, extending between the individual strands of the mesh, resist breaking off.

The strength of the cross-linked film makes it easier to wash non-exposed non-cross-linked, emulsion from the screen. Whereas previously, warm water was required, the non-exposed emulsion can be washed away with forceful sprays of cold water, the strength of the cross-linked film withstanding the force of such sprays.

Emulsions produced according to the present invention are substantially more light-sensitive than emulsions presently available. Using light exposure conditions which takes twenty to thirty minutes to correctly expose screens coated with available emulsions, a screen coated with emulsions of the present invention may be coated in about three minutes.

While the invention has been described in terms of certain preferred embodiments, modifications obvious to one with ordinary skill in the art may be made without departing from the scope of the present invention.

Various features of the invention are set forth in the following claims.

What is claimed is:

1. A high solids content, low viscosity water-based emulsion for application to a screen for silk screen imaging comprising an emulsion in water of
    (a) polyvinyl alcohol at a level of between about 5 and about 15 weight percent of said emulsion,
    (b) polyvinyl acetate and/or a polyvinyl acetate copolymer at a level of between about 15 and about 30 weight percent of said emulsion, the total polymer content of components (a) and (b) being in the range of from about 25 to about 35 weight percent of said emulsion,
    (c) diacetone acrylamide at a level of between about 4 and about 16 weight percent of said emulsion, and
    (d) an acrylic monomer at a level of between about 4 and about 8 weight percent of said emulsion, said emulsion having a solids content of between about 40 and about 50 weight percent, and having a viscosity of between about 20,000 and about 30,000 cps. at 25° C., a thixotropic index of between about 1 and about 2 at 25° C., and a specific gravity of between about 1 and about 1.25 at 25° C.

2. An emulsion according to claim 1 also including a photosensitive initiator for promoting light-induced polymerization of the monomers in said emulsion.

3. An emulsion in accordance with claim 1 also including a cyclic amide.

4. An emulsion in accordance with claim 3 wherein said cyclic amide is N-vinyl-2-pyrrolidone.

5. An emulsion in accordance with claim 1 wherein said emulsion also includes a phthalate plasticizer.

6. An emulsion in accordance with claim 1 wherein said emulsion also includes a thermal polymerization inhibitor.

7. An emulsion in accordance with claim 1 wherein said poly vinyl acetate copolymer is poly vinyl acetate-ethylene copolymer.

8. An emulsion in accordance with claim 1 wherein said acrylic monomer is an unsaturated ester of a polyol.

9. An emulsion in accordance with claim 1 in combination with a photosensitive, free radical-generating compound which initiates cross-linking of the polymers in said emulsion when exposed to light.

10. An emulsion in accordance with claim 1 wherein said acrylic monomer is selected from the group consisting of: 2 ethyl-hexyl acrylate, ethylene diacrylate; diethylene glycol diacrylate; glycerol diacrylate; glycerol triacrylate; ethylene dimethacrylate; 1,3-propylene dimethacrylate; 1,2,4-butanetriorylate; 1,3-propylene dimethacrylate; 1,2,4-butanetrioltrimethacrylate; 1,4-benzenediol dimethacrylate pentaerythritol tetramethacrylcate; 1,3-propanediol diacrylate; 1,6-hexanediol diacrylate; the bis-acrylates and methacrylates of polyethylene glycols of molecular weight 200–500; trimethlopropane triacrylate; pentaerythritol triacrylate and mixtures thereof.

* * * * *